United States Patent [19]
Fandrich et al.

[11] Patent Number: 5,369,754
[45] Date of Patent: Nov. 29, 1994

[54] BLOCK SPECIFIC STATUS INFORMATION IN A MEMORY DEVICE

[75] Inventors: Mickey L. Fandrich, Placerville; Chakravarthy Yarlagadda, Citrus Heights; Rodney R. Rozman, Placerville; Geoffrey A. Gould, El Dorado Hills, all of Calif.

[73] Assignee: Intel Corporation, Santa Clara, Calif.

[21] Appl. No.: 220,811

[22] Filed: Mar. 30, 1994

Related U.S. Application Data

[62] Division of Ser. No. 85,293, Jun. 30, 1993, Pat. No. 5,353,256.

[51] Int. Cl.$^5$ ............................................. G06F 12/00
[52] U.S. Cl. ..................................... 395/425; 395/725
[58] Field of Search .................. 395/425, 725; 365/900

[56] References Cited

U.S. PATENT DOCUMENTS 5,214,776  5/1993  Bagnoli ................................ 395/425
5,297,103  3/1994  Higuchi ................................ 365/900

*Primary Examiner*—Eugene R. LaRoche
*Assistant Examiner*—A. Zarahian
*Attorney, Agent, or Firm*—Blakely, Sokoloff Taylor & Zafman

[57] ABSTRACT

A flash memory device having a plurality of flash array blocks and a block status register circuit containing a block status register for storing a block status for each flash array block. A flash array controller circuit in the flash memory device performs program or erase operations on the flash array blocks, and maintains the block status in each block status register. An interface circuit in the flash memory device enables read access of the block status registers over a bus.

16 Claims, 12 Drawing Sheets

| BIT | DEFINITION | USAGE |
|---|---|---|
| 7 | BLK RDY/BSY | BLOCK READY/BUSY. '0' INDICATES THAT THE BLOCK IS BUSY. |
| 6 | BLOCK ENABLE | '0' LOCKS THE BLOCK FROM PROGRAM AND ERASE OPERATIONS. |
| 5 | OP FAIL | 1 = OPERATION ON BLOCK FAILED. |
| 4 | ABORT | 1 = OPERATION ABORTED ON BLOCK. |
| 3 | QFULL | 1 = OPERATION QUEUE FULL. |
| 2 | LOW VPP | 1 = VPP LOW DETECTED WHILE OPERATING ON BLOCK. |
| 1 | RESERVED | RESERVED. |
| 0 | RESERVED | RESERVED. |

*Figure 4b*

BLOCK SPECIFIC STATUS INFORMATION IN A MEMORY DEVICE

This is a divisional of application Ser. No. 08/085,293, filed Jun. 30, 1993 now U.S. Pat. No. 5,353,256.

BACKGROUND OF THE INVENTION

1. Field of the Invention

The present invention pertains to the field of integrated circuit memory devices. More particularly, this invention relates to block status registers in a memory device that provide user accessible block specific status information.

2. Art Background

A flash memory device contains a flash cell array for nonvolatile random access data storage in a computer system. A typical flash cell array may be subdivided into a set of flash array blocks. Prior flash memory devices usually implement a write control circuit for programming and erasing areas of the flash cell array. The write control circuit programs and erases the flash cells by applying a predetermined sequence of program level voltages to the flash cells.

Prior flash memory devices typically provide status information to the user through a status register. The write control circuit in such prior flash memory devices usually sets and clears status bits in the status register during program or erase operations. A driver program provided by the user reads the status register during data transfer sequences to the flash memory device. The driver program uses the status bits to determine proper synchronization and control of the data transfer. The status bits commonly include status bits indicating whether the flash memory device is either busy or ready to accept commands or data, and status bits indicating whether a program or erase operation has failed, as well as status bits indicating other status and error information.

Unfortunately, such prior flash memory devices only provide global status information to the user. The status information in such devices is global because the status bits indicate the status of the entire flash memory device even when the device is subdivided into multiple flash array blocks. As a consequence, the driver program must incur the overhead required to maintain a correlation between the global status information from the status register and the block specific operations on the flash array blocks. Such extra overhead greatly increase the cost and complexity of the driver program and can significantly decrease write transaction throughput to the flash memory devices.

SUMMARY AND OBJECTS OF THE INVENTION

One object of the present invention is to provide block specific status information in a flash memory device having multiple flash array blocks.

Another object of the present invention is to provide a set of block status registers in a flash memory device wherein each block status register provides status information for one flash array block of a multiple block flash cell array.

Another object of the present invention is to enable a user to read status information from the block status registers of a flash memory device while a flash array controller circuit in the flash memory device asynchronously reads and writes the block status information.

A further object of the present invention is to enable flexible upgrade of program or erase algorithms in a flash memory device by providing flexible non dedicated and non hardwired block status registers in the flash memory device.

These and other objects of the invention are provided by a flash memory device having a plurality of flash array blocks. Each flash array block comprising a plurality of flash cells for random access non volatile data storage. The flash memory device contains a block status register circuit having a plurality of block status registers. Each block status register stores a block status for one of the flash array blocks.

A flash array controller circuit in the flash memory device performs program or erase operations on the flash array blocks, and maintains the block status in each block status register. An interface circuit in the flash memory device enables user read access of the block status registers over a bus.

The block status register circuit comprises an array of block status register cells, an access logic circuit, and dummy column cells. The array of block status register cells has a plurality of rows and a plurality of columns, wherein each row of the block status register cells stores the block status for one of the flash array blocks. The dummy column cells match a latch control signal to the array of block status register cells.

The access logic circuit enables access to the block status register cells. The access logic circuit enables read and write access of the block status by the flash array controller circuit, and user read access of the block status through the interface circuit. The access logic circuit transfers the block status to each column of the block status register cells, and generates a set of read/write control signals for accessing each row of the block status register cells.

Other objects, features and advantages of the present invention will be apparent from the accompanying drawings, and from the detailed description that follows below.

BRIEF DESCRIPTION OF THE DRAWINGS

The present invention is illustrated by way of example and not limitation in the figures of the accompanying drawings in which like references indicate similar elements, and in which:

FIG. 4b illustrates the status bits of the block status registers which provide block specific status information for the corresponding flash array block of the flash array;

DETAILED DESCRIPTION

Figure 1:
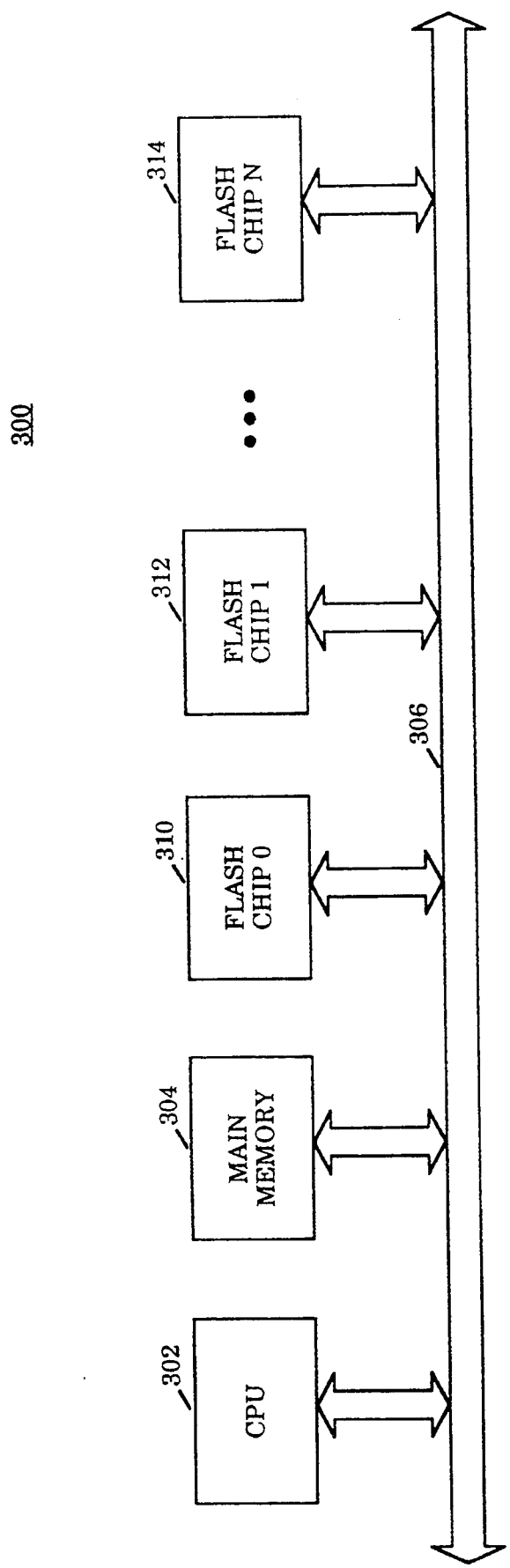
FIG. 1 is a block diagram of a computer system including a central processing unit (CPU), a main memory subsystem, and a set of flash memory devices.

FIG. 1 is a block diagram of a computer system 300. The computer system 300 is comprised of a central processing unit (CPU) 302, a main memory subsystem 304, and a set of flash memory devices 310-314. The CPU 302 communicates with the main memory subsystem 304 and the flash memory devices 310-314 over a host bus 306.

The flash memory devices 310-314 provide random access non volatile large scale data storage for the computer system 300. The CPU 302 reads the contents of the flash memory devices 310-314 by generating read memory cycles over the host bus 306. The CPU 302 writes to the flash memory devices 310-314 by transferring write commands and write data blocks to the flash devices 310-314 over the host bus 306.

Figure 2:
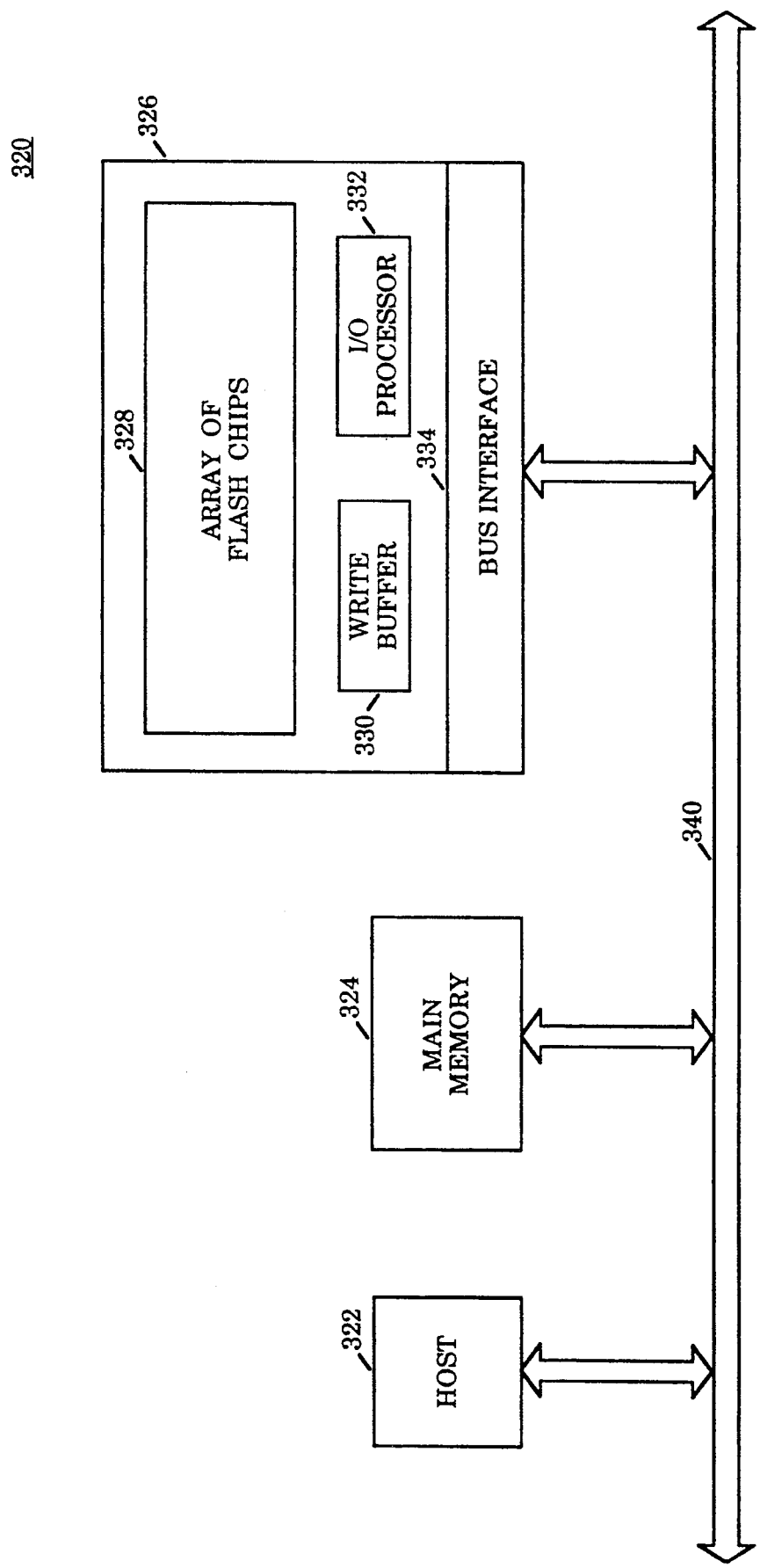
FIG. 2 is a block diagram of a computer system comprising a CPU, a main memory subsystem, and a flash memory subsystem.

FIG. 2 is a block diagram of a computer system 320. The computer system 320 is comprised of a host processor 322, a main memory subsystem 324, and a flash memory subsystem 326. The host processor 322, the main memory subsystem 324, and the flash memory subsystem 326 communicate over a host bus 340.

The flash memory subsystem 326 emulates a disk drive subsystem. The flash memory subsystem 326 is comprised of a bus interface circuit 334, a write buffer 330, an I/O processor 332, and an array of flash memory devices 328. The write buffer 330 buffers write data blocks targeted for the array of flash memory devices 328.

Each flash memory device in the array of flash memory devices 328 is substantially similar to the flash memory device 310. Each flash memory device in the array of flash memory devices 328 contains a flash array arranged as a set of 32 flash array blocks. Each flash memory device in the array of flash memory devices 328 implements a block status register circuit having a block status register for each of the 32 blocks of the flash array. The I/O processor 332 the reads blocks status registers to determine the status of each flash array block.

Figure 3:
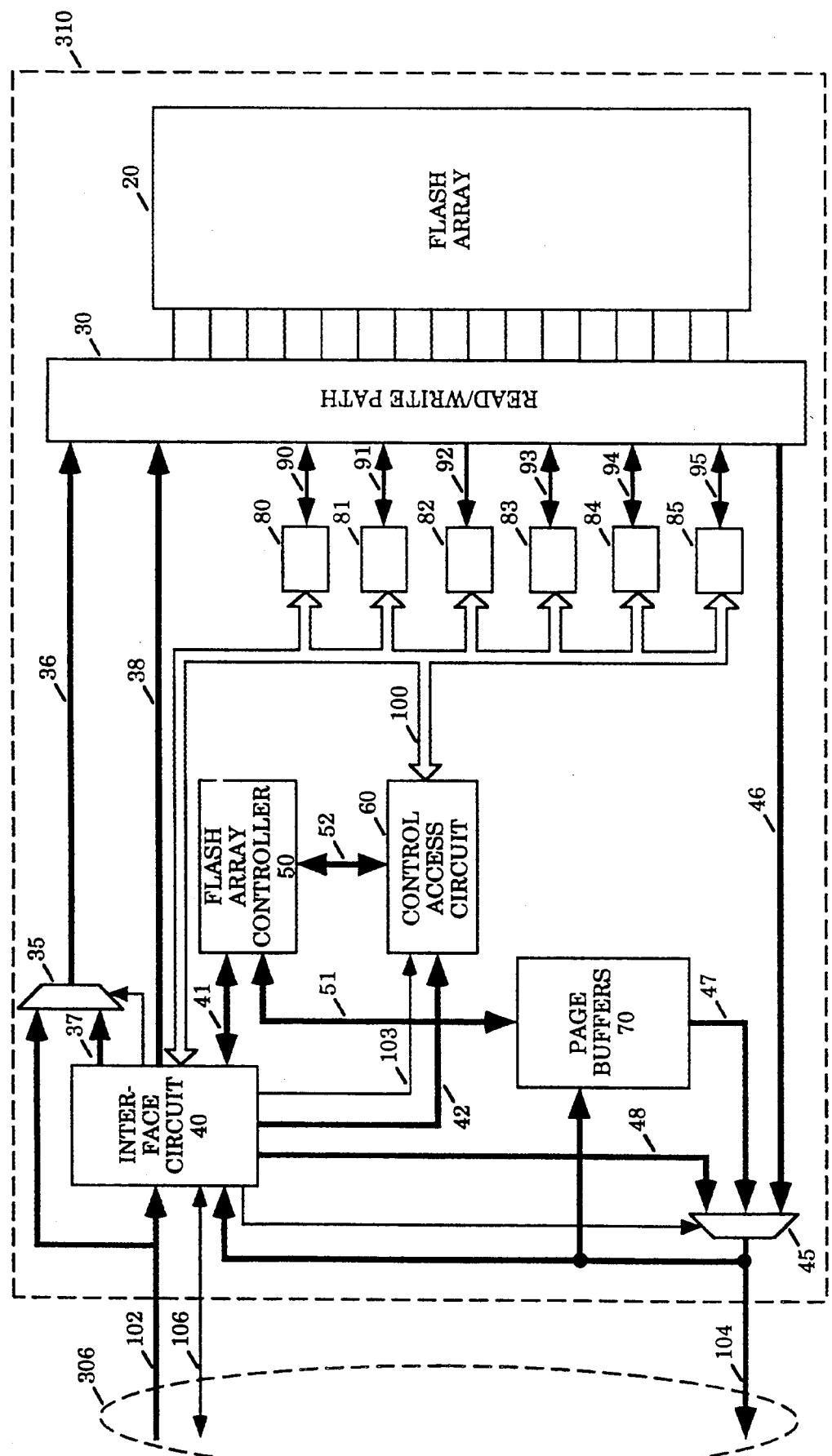
FIG. 3 is a block diagram of the flash memory device including a flash cell array, an interface circuit, a flash array controller, a set of page buffers, a set of control register circuits, and a set of read/write path circuitry.

FIG. 3 is a block diagram of the flash memory device 310. The flash memory device 310 is comprised of a flash cell array 20, an interface circuit 40, a flash array controller 50, a set of page buffers 70, a set of control register circuits 80-85, and a set of read/write path circuitry 30.

The flash cell array 20 provides random access non volatile large scale data storage. For one embodiment, the flash cell array 20 is arranged as a set of 32 flash array blocks, wherein each flash array block provides 64k bytes of data storage.

The flash memory device 310 is shown coupled to the host bus 306. The host bus 306 comprises an address bus 102, a data bus 104, and a control bus 106.

The read/write path circuitry 30 comprises read and write path circuitry for accessing the flash array 20. For example, the read/write path circuitry 30 includes row and column address decoding circuitry for the flash array 20. The read/write path circuitry 30 also includes redundancy circuitry for overriding addresses if a bad flash cell is detected in the flash array 20. The read/write path circuitry 30 also includes mini array circuitry for generating reference flash bits, and sense path circuitry for comparing the reference flash bits to bits from the flash array 20 to determine whether the bits are logic state 1 or logic state 0.

The read/write path circuitry 30 also includes multiplexer circuitry for selecting between bits from the flash array 20 and redundant bits, as well as multiplexer circuitry for selecting between the high and low bytes of the flash array 20 to provide for 8 bit and 16 bit accesses. The read/write path circuitry 30 includes output buffer circuitry for driving data from the flash array 20 over output pads of the flash memory device 310.

The read/write path circuitry 30 includes address transition detection circuitry. The address transition detection circuitry generates control pulses when address transitions are detected. The control pulses are employed to speed column charging at the outputs of the flash array 20 before data is ready.

The read/write path circuitry 30 includes high voltage circuitry for accessing the flash array 20. For example, the read/write path circuitry 30 includes VPX switching circuitry for setting the wordline voltage for programming data into the flash array 20, and VPY generator circuitry for setting the programming load line. The read/write path circuitry 30 also includes VSI generator circuitry for setting the source voltage of unselected blocks of the flash array 20 during programming.

The read/write path circuitry 30 also includes digital to analog conversion circuits for generating reference voltage levels for program verify operations, as well as erase verify and post erase repair operations. The read/write path circuitry 30 also includes VPS switch circuitry for setting the source voltage level to VPP during erase operations.

The control register circuits 80-85 contain sets of specialized control registers and associated circuitry for controlling a read/write path 30. The specialized control registers are programmed and accessed over a central control bus 100.

The interface circuit 40 enables access of the flash cell array 20 over the host bus 306 by receiving and processing commands over the host bus 306. The interface circuit 40 receives commands over the data bus 104, verifies the commands, and queues the commands to the flash array controller 50 over a queue bus 41. Thereafter, the flash array controller 50 executes the command using the appropriate portion of the flash memory device 310.

The flash array controller 50 is a specialized reduced instruction set processor for performing write operations on the flash array 20. The flash array controller 50 includes an arithmetic logic unit, general purpose registers, a control store and a control sequencer. The flash array controller 50 uses the commands received over the queue bus 41 to dispatch to the appropriate location of the control store to execute the command.

A control access circuit 60 enables both the interface circuit 40 and the flash array controller 50 to access the control register circuits 80–85 over the central control bus 100. During a normal mode of the flash memory device 310, the flash array controller 50 controls the control access circuit 60 and accesses the control register circuits 80–85 over the central control bus 100.

The flash array controller 50 writes to the specialized control registers by transferring a write control signal, and a register address along with corresponding write data to the control access circuit 60 over a bus 52. The control access circuit 60 then generates a write cycle over the central control bus 100 to program the addressed specialized control register. The flash array controller 50 reads the specialized control registers by transferring a register address and read control signal to the control access circuit 60 over the bus 52. The control access circuit 60 then generates a read access cycle over the central control bus 100 to read the addressed specialized control register.

The control register circuit 80 contains specialized control registers and circuitry for controlling the high voltage circuitry of the read/write path 30 according to a set of control signals 90. The high voltage control registers include source switch interface registers, interface registers for controlling VPX and VPIX multiplexers, VPP/VCC switch interface registers, interface registers for controlling reference generators, multiplexers and comparators, and programming data path interface registers.

The control register circuit 81 contains control registers and circuitry for controlling special column access circuitry of the read/write path 30 according to a set of control signals 91. The special column access control registers include mini-array interface registers, redundancy interface registers, imprint interface registers, and content addressable memory interface registers.

The control register circuit 82 contains a set of read only registers for sensing and latching a set of status signals 92 from the read/write path 30. The status signals 92 include the outputs of TTL buffers corresponding to input pads of the flash memory device 310, outputs of the sense amplifiers for the flash cell array 20, page buffer counter outputs, outputs of the comparators in the read/write path 30, and the flash array controller 50 program counter.

The control register circuit 83 contains control registers and circuitry for controlling the read path of the read/write path 30 according to a set of control signals 93. The read path control registers include automatic transition detection interface registers, sensing interface registers, x, y, and z path interface registers.

The control register circuit 84 contains interface registers to the flash array controller 50 and interface registers to the interface circuit 40. The control register circuit 85 contains registers for controlling special test features of the flash memory device 310 according to a set of control signals 95. The special test registers include test mode access registers, VPP capture registers, ready and busy modifier registers, and address allocation registers.

The interface circuit 40 controls an input address multiplexer 35 to select an input address 36 for the read/write path 30. The selected input address 36 is either the address sensed by TTL buffers (not shown) on the address bus 102, or a latched address 37 from the interface circuit 40. The input address 36 may be overridden by writing control registers in the control register circuit 84.

The interface circuit 40 controls an output data multiplexer 45 to select a source for output data transfer over the data bus 104. The selected output data is either flash array data 46 from the read/write path 30, page buffer data 47 from the page buffers 70, or block status register (BSR) data 48 from a set of block status registers contained within the interface circuit 40.

The page buffers 70 provide buffer storage areas for write sequences to the flash array 20 over the data bus 104. The page buffers 70 also provide a temporary control store area for the flash array controller 50. For one embodiment, the page buffers 70 are arranged as a set of two 256×8 bit page buffers.

The CPU 302 reads the flash cell array 20 by transferring addresses over the address bus 102 while signaling read cycles over the control bus 106. The interface circuit 40 detects the read cycles and causes the input address multiplexer 35 to transfer the addresses from the address bus 102 through to the x and y decode circuitry of the read/write path 30. The interface circuit 40 also causes the output data multiplexer 45 to transfer the addressed read data from the read/write path 30 over the data bus 104.

The CPU 302 writes data to the flash cell array 20 by generating write cycles over the host bus 306 to transfer write data blocks to the page buffers 70. The interface circuit 40 verifies the write command, and queues the write command to the flash array controller 50. The flash array controller 50 executes the write command by reading the write data from the data queue over a bus 51, and by programming the write data into appropriate areas of the flash array 20.

The flash array controller 50 implements algorithms for sequencing the high voltage circuitry of the read/write path 30 in order to apply charge to the flash cells of the flash cell array 20 and remove charge from the flash cells of the flash cell array 20. The flash array controller 50 controls the high voltage circuitry and addresses the flash array 20 by accessing the control register circuits 80–85 over the central control bus 100.

The read/write path 30 includes source switch circuitry for applying the appropriate voltage levels to the flash cell array 20 for an erase function. The read/write path 30 also includes program load circuitry for driving program level voltages onto the bit lines of the flash cell array 20 during a programming function.

The interface circuit 40 contains 32 block status registers. Each block status register corresponds to one of the blocks of the flash cell array 20. The flash array controller 50 maintains status bits in the block status registers to indicate the status of each block of the flash cell array 20. The CPU 302 reads the contents of the block status registers over the host bus 306.

Figure 4A:
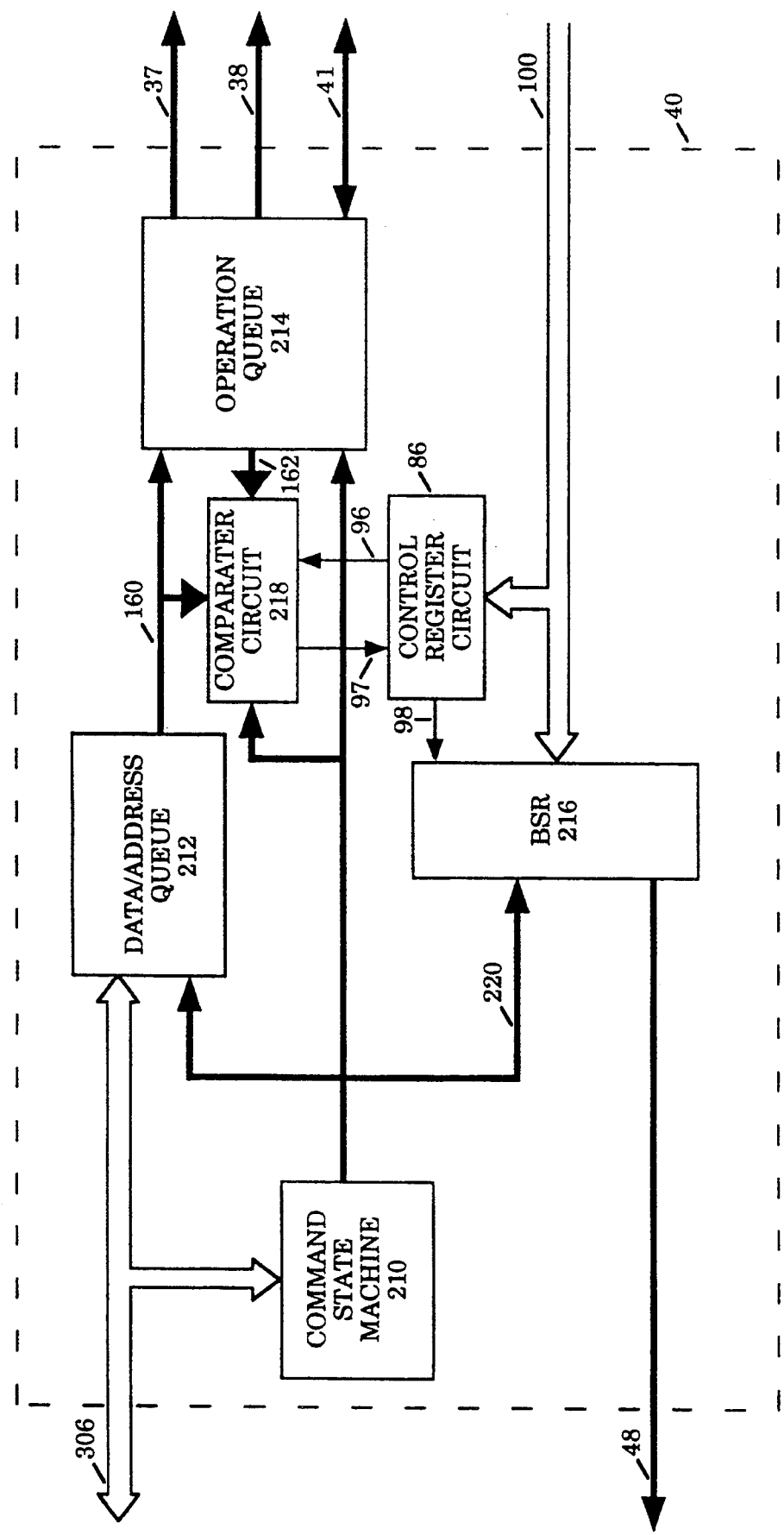
FIG. 4a is a block diagram of the interface circuit comprising a command state machine, a data/address queue, an operation queue, and a set of block status registers (BSR)

FIG. 4a is a block diagram of the interface circuit 40. The interface circuit 40 is comprised of a command state machine 210, a data/address queue 212, an operation queue 214, and a set of block status registers (BSR) 216.

The command state machine 210 receives commands from the CPU 302 over the host bus 306. The commands from the CPU 302 include commands for performing program or erase operations of the flash array 20, as well as commands for reading and clearing the status bits in the block status registers of the BSR 216.

The command state machine 210 verifies the commands, and transfers commands and associated parameters including a block address to the flash array controller 50 through the data/address queue 212 and the operation queue 214. For one embodiment, the data/address queue 212 holds one command operation, while the operation queue 214 holds two command operations, wherein a command operation comprises a command and associated parameters for the command.

The command state machine 210 processes commands for reading the block status registers of the BSR 216. The command state machine 210 selects the block status registers of the BSR 216 by transferring addresses and control signals to the BSR 216 over a command bus 220.

The operation queue 214 transfers the latched addresses 37 from the data/address queue 212 to the input multiplexer 35. The operation queue 214 also transfers the latched array data 38 from the data/address queue 212 to the read/write path 30. The operation queue 214 transfers the verified commands and associated parameters to the flash array controller 50 over the queue bus 41.

The BSR 216 contains a block status register for each of the flash array blocks of the flash array 20. Each block status register in the BSR 216 stores status bits that provide block specific status information to a user.

The flash array controller 50 maintains the status bits in the block status registers of the BSR 216. The flash array controller 50 accesses the block status registers of the BSR 216 over the central control bus 100. The flash array controller 50 performs both reads and writes to the BSR 216 over the central control bus 100.

The interface circuit 40 enables read access of the block status registers over the host bus 306. The CPU 302 reads the block status registers of the BSR 216 by transmitting read block status register commands to the command state machine 210 over the host bus 306. The read block status register commands include a 5 bit BSR address for selecting the 32 block status registers in the BSR 216.

The command state machine 210 transfers the BSR address over the command bus 220 to select the block status registers the BSR 216. The contents of the selected block status register are transferred from the BSR 216 to the output multiplexer 45 over the BSR data bus 48. The command state machine 210 causes the output multiplexer 45 to transfer the block status register read data on the BSR data bus 48 over the data bus 104.

FIG. 4b illustrates the status bits of the block status registers in the BSR 216 for one embodiment. The status bits provide block specific status information for the corresponding flash array block of the flash array 20.

The RDY/BSY bit of a block status register indicates whether the corresponding block of the flash array 20 is busy. The RDY/BSY bit is employed to inhibit the CPU 302 from performing a read operation to the flash array 20 while the flash array controller 50 performs a program or erase operation.

The RDY/BSY bit is set to "ready" when the flash memory device 304 powers up. The RDY/BSY is set to "busy" when the flash array controller 50 is active. The RDY/BSY bit is maintained by the flash array controller 50 while processing commands.

The interface circuit 40 implements circuitry for setting the RDY/BSY bit to "busy" when a command is queued to the flash array controller 50. By setting the RDY/BSY bit to "busy" when a command is queued to the flash array controller 50, the CPU 302 is inhibited from beginning another operation to the corresponding flash array block before the flash array controller 50 can set the BSY bit when processing the last command.

A comparator circuit 218 receives the block address for the command operation held by the data/address queue over a temporary queue bus 160. The comparator circuit 218 also receives the block addresses held by the operation queue 214 over a bus 162.

During a read block status register command from the user, the comparator circuit 218 receives the 5 bit BSR address over the command bus 220. The comparator circuit 218 compares the 5 bit BSR address to the block addresses from the data/address queue 218 and the operation queue 214, and generates a BSY override signal 97 is a match occurs.

A control register circuit 86 receives the BSY override signal 97, and generates a set BSY signal 98 by performing a logical OR of the BSY override signal 97 with a global BSY bit stored in a control register circuit in the control register circuit 86. The global BSY bit is loaded into the control register by the flash array controller 50 over the control bus 100.

The set BSY signal 98 causes the BSR 216 to replace the RDY/BSY from the selected block status register with a "busy" status bit. A disable override signal 96 disables the comparator circuit 218 and thereby disables the override function. The disable override signal is loaded into a control register in the control register circuit 86 by the flash array controller 50.

The BLOCK ENABLE bit indicates whether the corresponding flash array block is locked from program or erase operations. The BLOCK ENABLE bit is set to "lock" when the flash memory device 304 powers up. Thereafter, the BLOCK ENABLE bit is maintained by the flash array controller 50 according to block enable status information stored in the flash array 20.

The OP FAIL bit indicates whether a program or erase operation to the corresponding block of the flash array 20 has failed. The OP FAIL bit is cleared when the flash memory device 304 powers up. Thereafter, the OP FAIL bit is maintained by the flash array controller 50 while processing commands.

The ABORT bit indicates whether a program or erase operation to the corresponding block of the flash array 20 has been aborted. A program or erase operation may be aborted when the flash memory device 304 enters a shutdown mode for power conservation, via an abort or power down user command.

The flash memory device 304 enters a shutdown mode when the CPU 302 transfers a shutdown command to the interface circuit 40 over the host bus 306. The shutdown command causes the flash array controller 50 to shut down circuitry in the flash memory device 304 that is normally active. The flash array controller 50 switches the circuitry into a standby mode for reducing power consumption. The flash array controller 50 sets the ABORT bit to indicate whether a program or erase operation to the flash array 20 was aborted by the shutdown operation.

The QFULL bit indicates whether the command queue from the interface circuit 40 to the flash array controller 50 is full. The QFULL bit is used to inhibit the CPU 302 transferring commands that require execution by the flash array controller 50 to the interface circuit 40 while the command queue is full.

The LOW VPP bit indicates whether the flash array controller 50 detected a low Vpp condition during a program or erase operation to the flash array cell 20.

The block specific status information available through the 32 block status registers in the BSR 216 enables the CPU 302 to conduct program and erase operations over the host bus 306 while treating each flash array block as a separate flash memory device.

Figure 5:
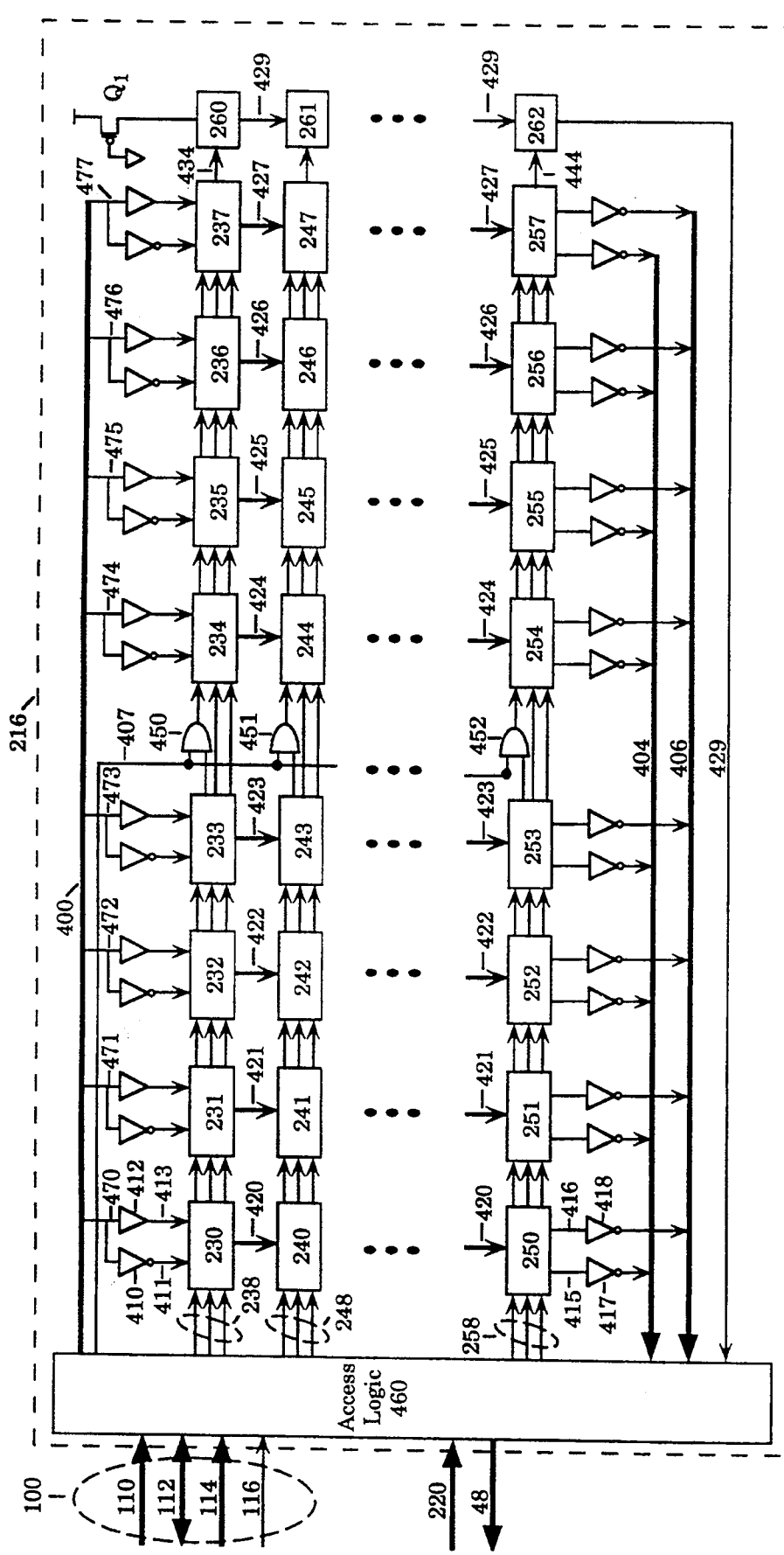
FIG. 5 illustrates the BSR which contains the block status registers for the flash memory device that correspond to the 32 flash array blocks (flash array blocks 0-31) of the flash array.

FIG. 5 illustrates the BSR 216 which contains the block status registers for the flash memory device 310. The block status registers correspond to the 32 flash array blocks (flash array blocks 0–31) of the flash array 20. The BSR 216 is comprised of an access logic circuit 460, a set of BSR cells 230–257, and a set of dummy column cells 260–262. For one embodiment, the BSR 216 is arranged as a 32 row by 8 column dual-port static random access memory.

The block status register corresponding to the flash array block 0 comprises the BSR cells 230–237 in row 0. The BSR cell 230 stores the RDY/BSY bit and the BSR cell 231 stores the ABORT bit corresponding to the flash array block 0. The BSR cell 232 stores the OP FAIL bit and the BSR cell 233 stores the LOW VPP bit corresponding to the flash array block 0. The BSR cell 234 stores the BLOCK ENABLE bit and the BSR cell 235 stores the QFULL bit corresponding to the flash array block 0. The BSR cells 236 and 237 are reserved bits for the flash array block 0.

The BSR cells 240–247 in row 1 comprise the block status register for the flash array block 1. The BSR cell 240 stores the RDY/BSY bit and the BSR cell 241 stores the ABORT bit corresponding to the flash array block 1. The BSR cell 242 stores the OP FAIL bit and the BSR cell 243 stores the LOW VPP bit corresponding to the flash array block 1. The BSR cell 244 stores the BLOCK ENABLE bit and the BSR cell 245 stores the QFULL bit corresponding to the flash array block 1. The BSR cells 246 and 247 are reserved bits for the flash array block 1.

Similarly, the BSR cells 250–257 in row 31 comprise the block status register for the flash array block 31. The BSR cell 250 stores the RDY/BSY bit, the BSR cell 251 stores the ABORT bit, the BSR cell 252 stores the OP FAIL bit, the BSR cell 253 stores the LOW VPP bit, the BSR cell 254 stores the BLOCK ENABLE bit, and the BSR cell 255 stores the QFULL bit corresponding to the flash array block 31. The BSR cells 256 and 257 are reserved bits for the flash array block 31.

The access logic circuit 460 enables read and write access of the BSR cells 230–257 over the central control bus 100. The central control bus 100 comprises a flash I/O address (FIOADD) bus 110, a flash I/O data (FIODAT) bus 112, a flash I/O control (FIOCTL) bus 114, and a strobe signal 116.

The access logic circuit 460 enables read access of the BSR cells 230–257 over the host bus 306 through the command state machine 210. For read accesses over the host bus 306, the command state machine 210 addresses the BSR cells 230–257 over the command bus 220. The selected contents of the BSR cells 230–257 are returned over the BSR data bus 48.

The access logic circuit 460 transfers write data to the columns of the BSR cells 230–257 over a set of column data lines 400. The column data lines 400 comprise a set of write data lines 470–477. The write data lines 470–477 provide write bits and inverted write bits to the BSR cells 230–257 through corresponding sets of write bit buffers and write bit inverters.

For example, the write data line 470 provides an inverted write bit 411 and a write bit 413 to the BSR cell 230 through a write bit inverter 410 and a write bit buffer 412.

The access logic circuit 460 generates a set of read/write control signals for each row of the BSR cells 230–257. The read/write control signals include controller write signals for writes by the flash array controller 50, controller read signals for reads by the flash array controller 50, and interface read signals for user reads through the interface circuit 40.

The access logic circuit 460 generates a set of read/write control signals 238 for the row 0 BSR cells 230–237. Similarly, the access logic circuit 460 generates a set of read/write control signals 248 for the row 1 BSR cells 240–247, and generates a set of read/write control signals 258 for the row 31 BSR cells 250–257.

Each column of the BSR cells 230–257 is coupled to a set of column signal lines. For example, the BSR cells 230, 240 and 250 are coupled to a set of column signal lines 420. Similarly, a set of column signal lines 421 is coupled to the column comprising the BSR cells 231, 241 and 251.

Each set of column signal lines 420–427 include the write bit and inverted write bit corresponding to the column, as well as a controller read data line for reads by the flash array controller 50 and an interface read data line for user reads through the interface circuit 40.

The data on the controller read data lines of the column signal lines 420–427 is transferred to the access logic circuit 460 over a set of controller read lines 404. For example, the BSR cell 250 transfers controller read data on a controller read data line 415 to the access logic circuit 460 through an inverter 417 and over the controller read lines 404.

The data on the interface read data lines of the column signal lines 420–427 is transferred to the access logic circuit 460 over a set of interface read lines 406. For example, the BSR cell 250 transfers interface read data on an interface read data line 416 to the access logic circuit 460 through an inverter 418 and over the interface read lines 406.

The BSR cells 230–257 are each substantially similar. The BSR cells 230–237 each implement circuitry similar to the circuitry in each BSR cell 240–257. However, each BSR cell 230–237 also includes a pull-up transistor coupled to the corresponding controller read data line and a pull-up transistor coupled to the corresponding interface read data line.

A set of AND gates 450–452 enable and disable transfer of the controller write signals from the access logic circuit 460 to the last four BSR cells in each row of the BSR cells 230–257. The AND gates 450–452 enable and disable the controller write signal according to a controller write disable signal 407. The controller write disable signal 407 is programmed by the flash array controller 50 through the access logic circuit 460.

The AND gate 450 enables and disables transfer of the controller write signal of the read/write signals 238 to the BSR cells 234–237. The AND gate 451 enables and disables transfer of the controller write signal of the read/write signals 248 to the BSR cells 244–247. The AND gate 452 enables and disables transfer of the controller write signal of the read/write signals 258 to the BSR cells 254–257.

The BSR 216 includes a set of dummy column cells 260–262 for generating a latch control signal over a dummy column line 429. The latch control signal 429 latches the contents of the selected block status register row during user reads through the interface circuit 40. The dummy column cells 260–262 match the phase of the latch control signal 429 to the particular row of the BSR cells 230–257 being accessed.

Each dummy column cell 260–262 is coupled to the dummy column line 429, and the dummy column line 429 is coupled to a pull-up transistor Q1. Each dummy column cell 260–262 pulls down the voltage level on the dummy column line 429 when the access logic circuit 460 generates a corresponding interface read signal.

For example, the dummy column cell 260 receives an interface read signal 434 corresponding to row 0 of the BSR cells 230–257 from the access logic circuit 460. The dummy column cell 260 pulls down the voltage level on the dummy column line 429 in response to the interface read signal 434.

Figure 6:
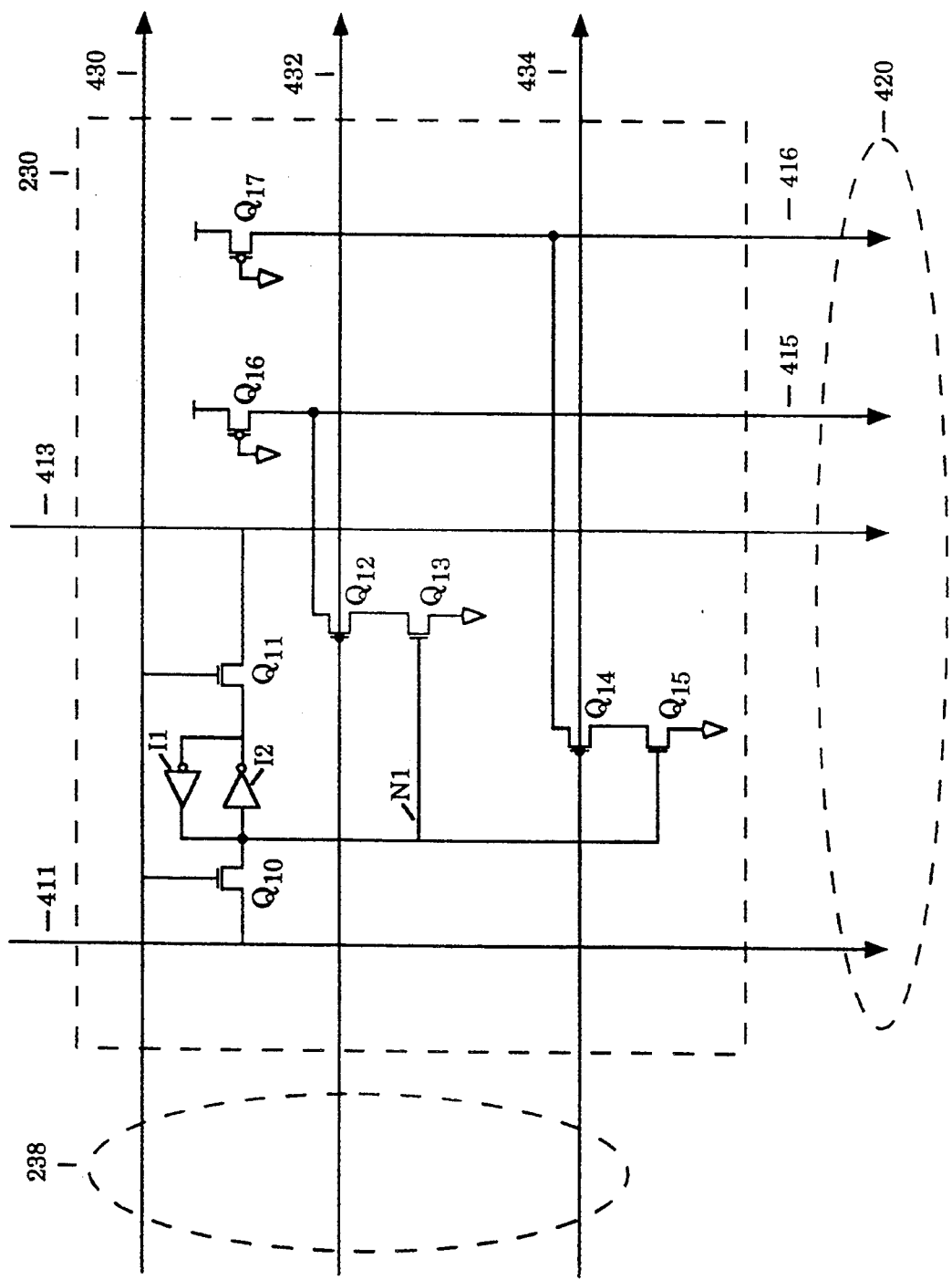
FIG. 6 illustrates a BSR cell which is comprised of an SRAM cell circuit, a controller read circuit, and an interface read circuit.

FIG. 6 illustrates the BSR cell 230. The BSR cells 231–237 are substantially similar to the BSR cell 230. The BSR cell 230 is comprised of an SRAM cell circuit, a controller read circuit, and an interface read circuit. The BSR cell 230 also includes a pull up transistor Q16 coupled to the controller read data line 415, and a pull up transistor Q17 coupled to the interface read data line 416.

The access logic circuit 460 generates the read/write control signals 238 for the row 0 BSR cells 230–237. The read/write control signals 238 include a controller write signal 430 for writes by the flash array controller 50, a controller read signal 432 for reads by the flash array controller 50, and an interface read signal 434 for user reads through the interface circuit 40.

The column signal lines 420 include the write bit 413 and the inverted write bit 411, as well as a controller read data line 415 for reads by the flash array controller 50 and an interface read data line 416 for reads caused by the interface circuit 40.

The SRAM cell circuit comprises a pair of transistors Q10 and Q11 along with a pair of inverter circuits I1 and I2. The SRAM cell circuit stores a corresponding status bit for the block status register row 0. The data on the inverted write bit 411 and the write bit 413 is stored in the SRAM cell circuit under control of the controller write signal 430 which is coupled to the gates of the transistors Q10 and Q11.

The controller read circuit comprises a pair of transistors Q12 and Q13. The gate of the transistor Q13 senses the data stored in the SRAM cell circuit at a node N1. The gate of the transistor Q12 is coupled to the controller read signal 432. When the flash array controller 50 issues the controller read signal 432, the transistor Q12 switches on. When the transistor Q12 switches on, the voltage on the controller read data line 415 is driven low if the voltage at the node N1 is high, and the voltage on the controller read data line 415 is driven high if the voltage at the node N1 is low. The inverter 417 restores the proper state of the status bit stored in the SRAM cell circuit for transfer to the access logic circuit 460 over the controller read lines 404.

The interface read circuit comprises a pair of transistors Q14 and Q15. The gate of the transistor Q15 senses the data stored in the SRAM cell circuit at the node N1. The gate of the transistor Q14 is coupled to the interface read signal 434. When the interface circuit 40 issues the interface read signal 434, the transistor Q14 switches on and drives the voltage on the interface read data line 416 low if the voltage at the node N1 is high, or high if the voltage at the node N1 is low. The inverter 418 restores the proper state of the status bit stored in the SRAM cell circuit for transfer to the access logic circuit 460 over the interface read lines 406.

Figure 7:
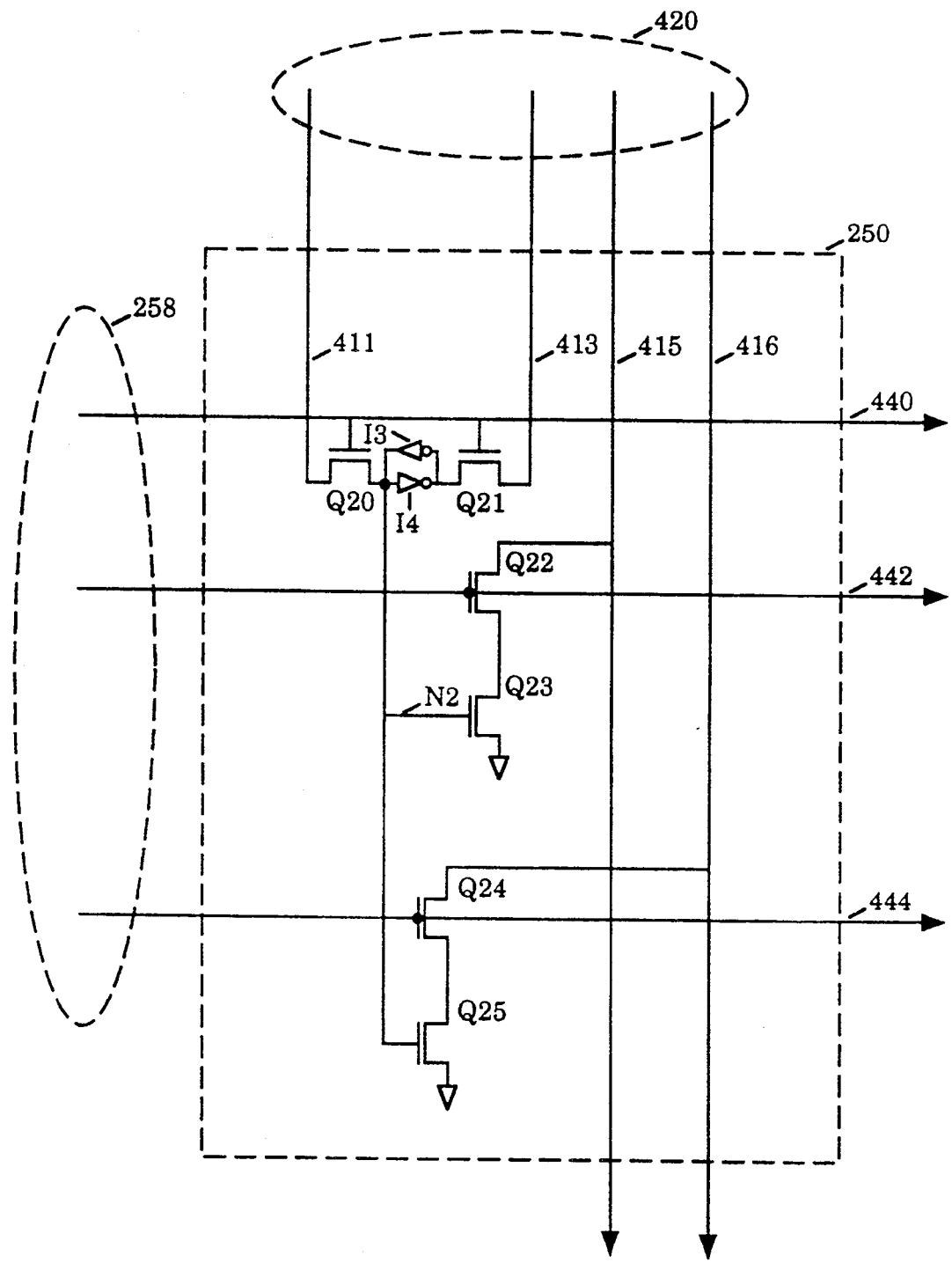
FIG. 7 illustrates another BSR cell which is comprised of an SRAM cell circuit, a controller read circuit, and an interface read circuit.

FIG. 7 illustrates the BSR cell 250. The BSR cells 251–257 are substantially similar to the BSR cell 250. The BSR cell 250 is comprised of an SRAM cell circuit, a controller read circuit, and an interface read circuit.

The access logic circuit 460 generates the read/write control signals 258 for the row 31 BSR cells 250–257. The read/write control signals 258 include a controller write signal 440 for writes by the flash array controller 50, a controller read signal 442 for reads by the flash array controller 50, and an interface read signal 444 for user reads through the interface circuit 40.

The BSR cell 250 is coupled to the column signal lines 420 including the write bit 413, the inverted write bit 411, the controller read data line 415, and the interface read data line 416.

The SRAM cell circuit for the BSR cell 250 comprises a pair of transistors Q20 and Q21 along with a pair of inverter circuits I3 and I4 that store a corresponding status bit for the block status register row 31. The data on the inverted write bit 411 and the write bit 413 is stored in the SRAM cell circuit under control of the controller write signal 440 which is coupled to the gates of the transistors Q20 and Q21.

The controller read circuit comprises a pair of transistors Q22 and Q23. The gate of the transistor Q23 senses the data stored in the SRAM cell circuit at a node N2. The gate of the transistor Q22 is coupled to the controller read signal 442. When the interface circuit 40 issues the controller read signal 442, the transistor Q22 switches on and drives the voltage on the interface read data line 415 low if the voltage at the node N2 is high, or high if the voltage at the node N2 is low. The inverter 417 restores the proper state of the status bit for transfer to the access logic circuit 460 over the controller read lines 404.

The interface read circuit comprises a pair of transistors Q24 and Q25. The gate of the transistor Q25 senses the data stored in the SRAM cell circuit at the node N2. The gate of the transistor Q24 is coupled to the interface read signal 444. When the interface circuit 40 issues the interface read signal 444, the transistor Q24 switches on and drives the voltage on the interface read data line 416 low if the voltage at the node N2 is high, or high if the voltage at the node N2 is low. The inverter 418 restores the proper state of the status bit for transfer to the access logic circuit 460 over the interface read lines 406.

Figure 8:
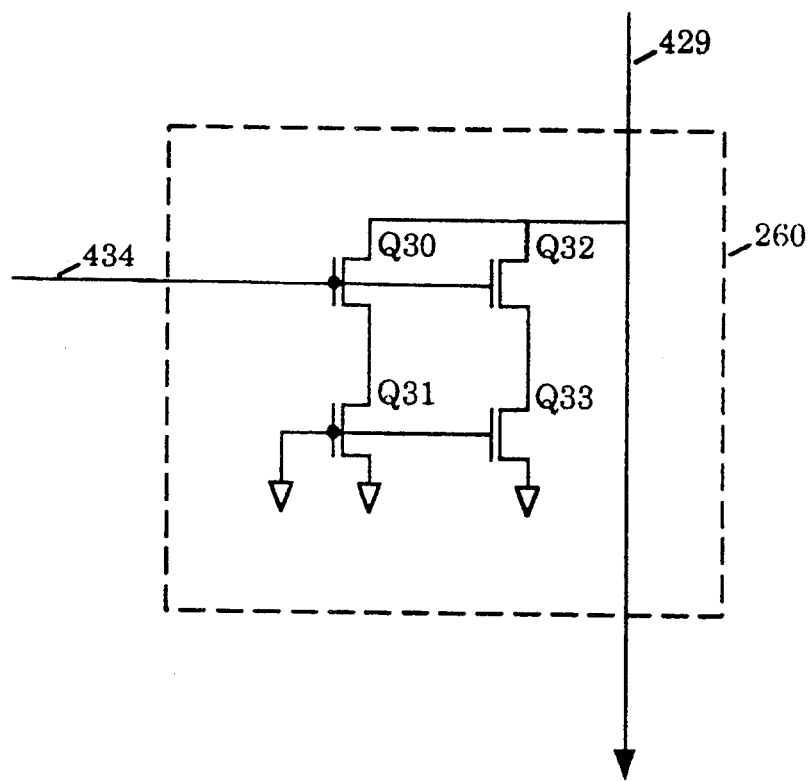
FIG. 8 illustrates a dummy column cell which is comprised of a pair of transistor stages.

FIG. 8 illustrates the dummy column cell 260. The dummy column cells 261–262 are substantially similar to the dummy column cell 260. The dummy column cell 239 is comprised of a pair of transistor stages. One stage comprises a pair of transistors Q30 and Q31, and another stage comprises a pair of transistors Q32 and Q33.

The gates of the transistors Q30 and Q32 are coupled to the interface read signal 434. When the interface circuit 40 issues the interface read signal 444, the voltage at the dummy column line 429 transitions from a low level to a high level. The low to high transition of the latch control signal 429 closes an output latch in the access logic circuit 460 to latch the block status register data for the user read through the interface circuit 40.

The rise time of the latch control signal 429 is longer than the rise time on the interface read data lines because the transistors Q30–Q33 provide double the load capacitance for the pull-up transistor Q1 when compared with the pull-up transistors of interface read circuits in the BSR cells 230–257.

Figure 9:
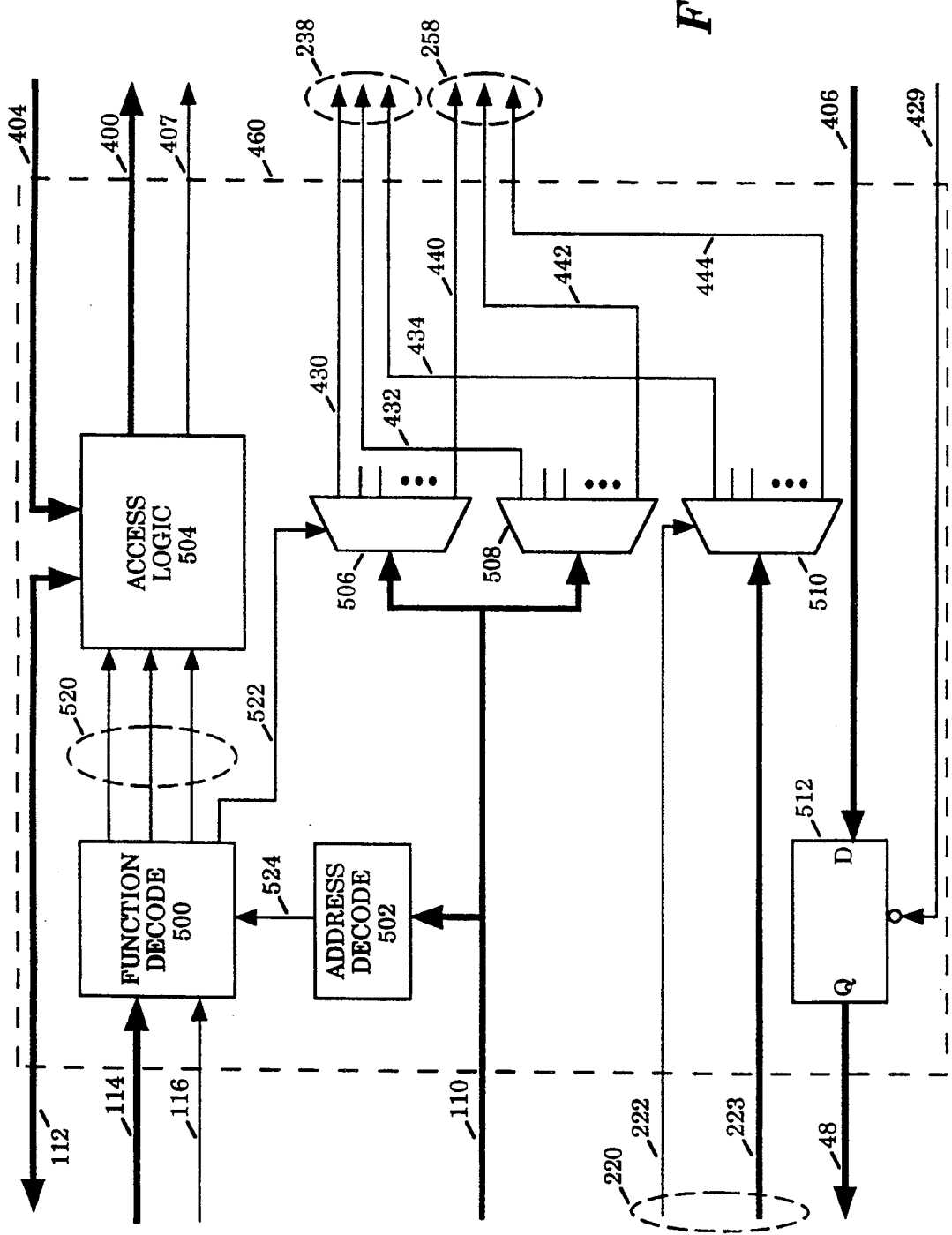
FIG. 9 illustrates the access logic circuit which is comprised of a function decode circuit, an address decode circuit, an access logic circuit, along with a controller write decoder, a controller read decoder, an interface read decoder 510, and an interface output latch 512.

FIG. 9 illustrates the access logic circuit 460. The access logic circuit 460 is comprised of a function decode circuit 500, an address decode circuit 502, an access logic circuit 504, along with a controller write decoder 506, a controller read decoder 508, and an interface read decoder 510. The access logic circuit 460 also comprises an interface output latch 512 for latching the interface read lines 406 under control of the latch control signal 429.

The flash array controller 50 selects the block status registers of the BSR 216 by transferring addresses over the FIOADD bus 110. The flash array controller 50 transfers data to and from the block status registers of the BSR 216 over the FIODAT bus 112. The flash array controller 50 specifies an access function for the block status registers of the BSR 216 over the FIOCTL bus 114. Write cycles to the block status registers of the BSR 216 are synchronized by the strobe signal 116.

The address decode circuit 502 decodes the address on the FIOADD bus 110, and generates a control signal 524 if the address corresponds to the BSR 216. The control signal 524 causes the function decode circuit 500 to decode the access function on the FIOCTL bus 114, and to generate a set of control signals 520 and 522 according to the access function.

The access logic circuit 504 receives the control signals 520 and performs the specified access function. The access functions specified by the control signals 520 include reading the block status register specified on the FIOADD bus 110, setting a bit of the block status register specified on the FIOADD bus 110, resetting a bit of the block status register specified on the FIOADD bus 110, and writing the block status register specified on the FIOADD bus 110. The bits of the block status register for the set and reset access functions are specified on the FIOADD bus 110.

In addition, the access functions specified by the control signals 520 include enabling and disabling of the last four BSR cells in each row of the BSR cells 230–257.

During a read block status register operation by the flash array controller 50, the access logic circuit 504 receives read data from the BSR cells 230–257 over the controller read lines 404. The access logic circuit 504 transfers the read data to the flash array controller 50 over the FIODAT bus 112.

During a write block status register operation by the flash array controller 50, the access logic circuit 504 receives write data over the FIODAT bus 112. The access logic circuit 504 transfers the write data to the BSR cells 230–257 over the column data lines 400.

During a bit set or bit reset block status register operation by the flash array controller 50, the access logic circuit 504 receives data from the specified BSR cells 230–257 over the controller read lines 404. The access logic circuit 504 sets or clears the specified bit, and transfers the block status register data back to the BSR cells 230–257 over the column data lines 400.

During an enable or disable operation of the last four BSR cells in each row by the flash array controller 50, the access logic circuit 504 sets or resets the controller write disable signal 407. Accordingly, the AND gates 450–452 enable or disable transfer of the controller write signals to the last four BSR cells in each row of the BSR cells 230–257.

The controller write decoder 506, the controller read decoder 508, and the interface read decoder 510 generate the read/write control signals for each blocks status register row of the BSR cells 230–257. For example, the controller write decoder 506, the controller read decoder 508, and the interface read decoder 510 generate the read/write control signals 238 for the row 0 block status register, and the read/write control signals 258 for the row 31 block status register.

The controller write decoder 506 generates the controller write signals for each block status register row of the BSR cells 230–257 by receiving and decoding block status register addresses from the flash array controller 50 over the FIOADD bus 110. The function decode circuit 500 generates a control signal 522 to enable the controller write signals according to the access mode specified on the FIOCTL bus 114.

The controller read decoder 508 generates the controller read signals for each block status register row of the BSR cells 230–257 by receiving and decoding block status register addresses from the flash array controller 50 over the FIOADD bus 110. The controller read signals are always enabled.

The interface read decoder 510 generates the interface read signals for each block status register row of the BSR cells 230–257 by receiving and decoding block status register addresses from the command state machine 210. The block status register addresses are received over the command bus 220 which comprises an interface address 223 and an interface read signal 222. The interface read decoder 510 decodes the block status register addresses on the interface address 223. The interface read signal 222 enables the interface read signals.

The latch control signal 429 causes the interface output latch 512 to latch data from the BSR cells 230–257 over the interface read lines 406. The output of the interface output latch 512 drives the BSR data bus 48 for user read blocks status register operations through the interface circuit 40. The interface output latch 512 provides steady output data for user block status register reads even though the interface circuit 50 asynchronously writes to the block status registers.

Figure 10A:
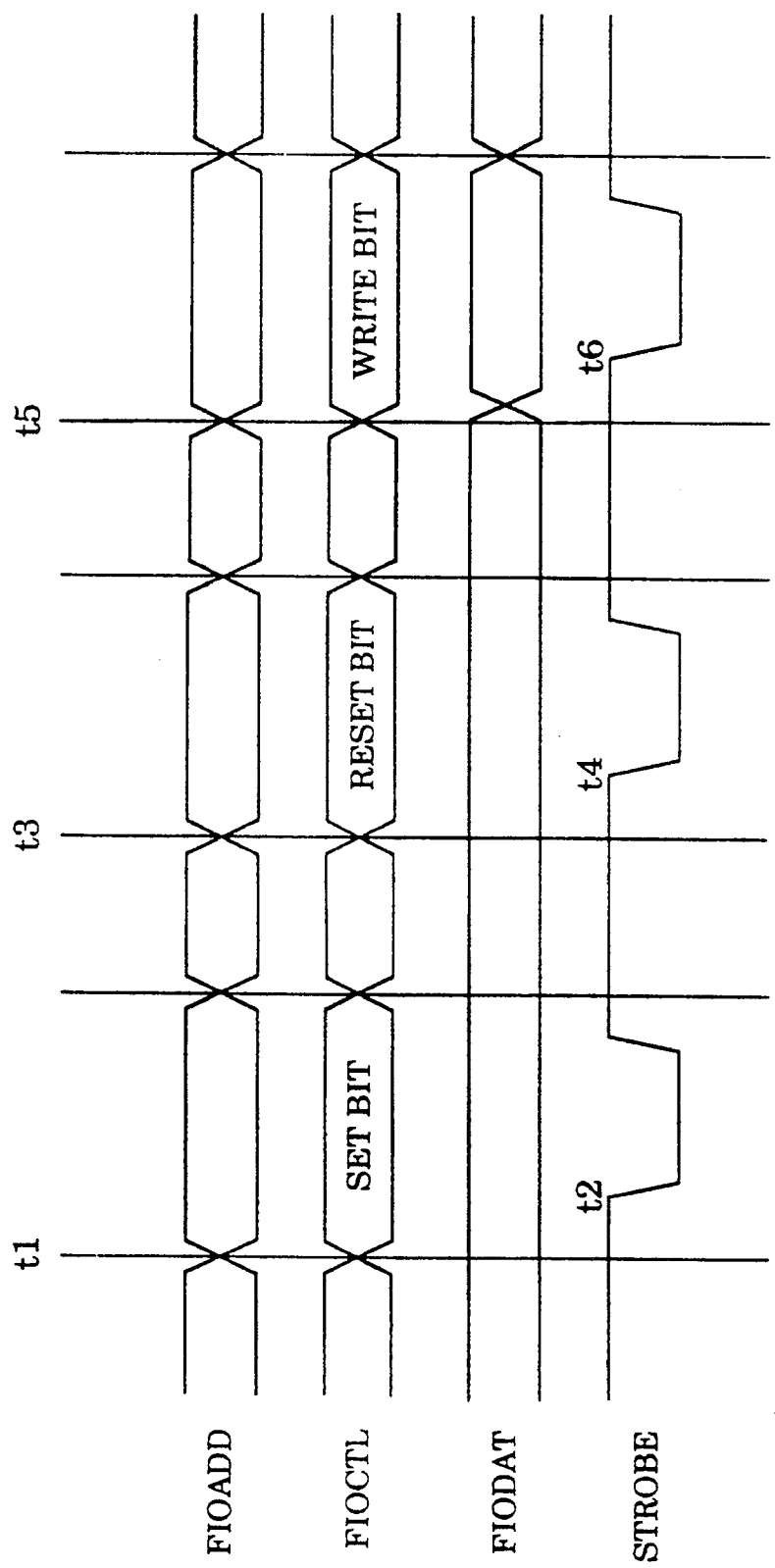
FIG. 10a is a timing diagram illustrating write operations by the flash array controller to the block status registers of the BSR.

FIG. 10a is a timing diagram illustrating write operations by the flash array controller 50 to the block status registers of the BSR 216. The timing diagram illustrates timing of the control bus 100 during a set bit operation starting at time t1, a reset bit operation starting at time t3, and a write block status register operation starting at time t5.

At time t1, the flash array controller 50 selects a block status register bit by transferring a block status register address and a bit address over the FIOADD bus 110. The bit address specifies one of the eight bits of the selected block status register. The controller read decoder 508 decodes the block status register address, and generates the appropriate controller read signal to read the block status register data from the BSR cells 230–257. Also at time t1, the flash array controller 50 signals the set bit access function on the FIOCTL bus 114.

Between time t1 and time t2, the access logic circuit 504 receives data from the specified block status register over the controller read lines 404 and sets the specified bit. Thereafter, the access logic circuit 504 transfers the modified block status register data back to the BSR cells 230-257 over the column data lines 400. At time t2, the flash array controller 50 asserts the strobe signal 116. The strobe signal 116 causes the function decode circuit 500 to enable the controller write decoder 506, which generates the selected controller write signal to store the modified block status register data.

At time t3, the flash array controller 50 selects a block status register bit over the FIOADD bus 110, and the controller read decoder 508 decodes the block status register address to read the selected block status register. Also at time t3, the flash array controller 50 signals the reset bit access function on the FIOCTL bus 114.

Between time t3 and time t4, the access logic circuit 504 receives data from the specified block status register over the controller read lines 404 and sets the specified bit. Thereafter, the access logic circuit 504 transfers the modified block status register data back to the selected block status register over the column data lines 400. At time t4, the flash array controller 50 asserts the strobe signal 116 to enable the controller write decoder 506, which generates the appropriate controller write signal to store the block status register data.

At time t5, the flash array controller 50 selects a block status register for the write operation by transmitting a block status register bit address over the FIOADD bus 110, and by selecting the appropriate block status register. Also at time t5, the flash array controller 50 signals the write block status register access function on the FIOCTL bus 114. The access logic circuit 504 receives the write data from the interface controller 50 over the FIODAT bus 112, and transfers the write data to the BSR cells 230-257 over the column data lines 400.

At time t6, the flash array controller 50 asserts the strobe signal 116, which causes the function decode circuit 500 to enable the controller write decoder 506. The controller write decoder 506 decodes the block status register address on the FIOADD bus 110, and generates the appropriate controller write signal to store the write data in the block status register.

Figure 10B:
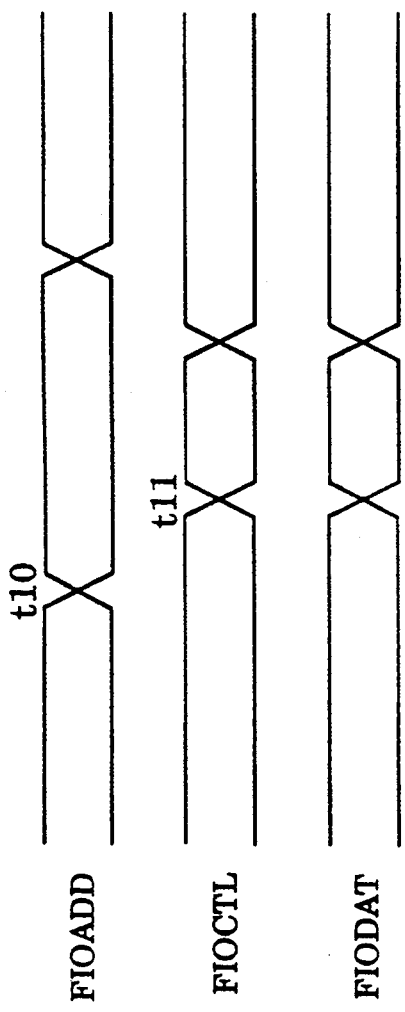
FIG. 10b is a timing diagram illustrating a read operation by the flash array controller from the block status registers of the BSR.

FIG. 10b is a timing diagram illustrating a read operation by the flash array controller 50 from one of the block status registers of the BSR 216. The timing diagram illustrates timing of the control bus 100.

At time t10, the flash array controller 50 selects a block status register for the read operation by transmitting a block status register address over the FIOADD bus 110, and by selecting the appropriate block status register. The controller read decoder 508 decodes the block status register address, and generates the appropriate controller read signal to read the block status register data from the BSR cells 230-257.

Also at time t11, the flash array controller 50 signals the read block status register access function on the FIOCTL bus 114. The access logic circuit 504 receives the read data from the BSR cells 230-257 over the controller read lines 404, and transfers the read data over the FIODAT bus 112 to the flash array controller 50.

Figure 10C:
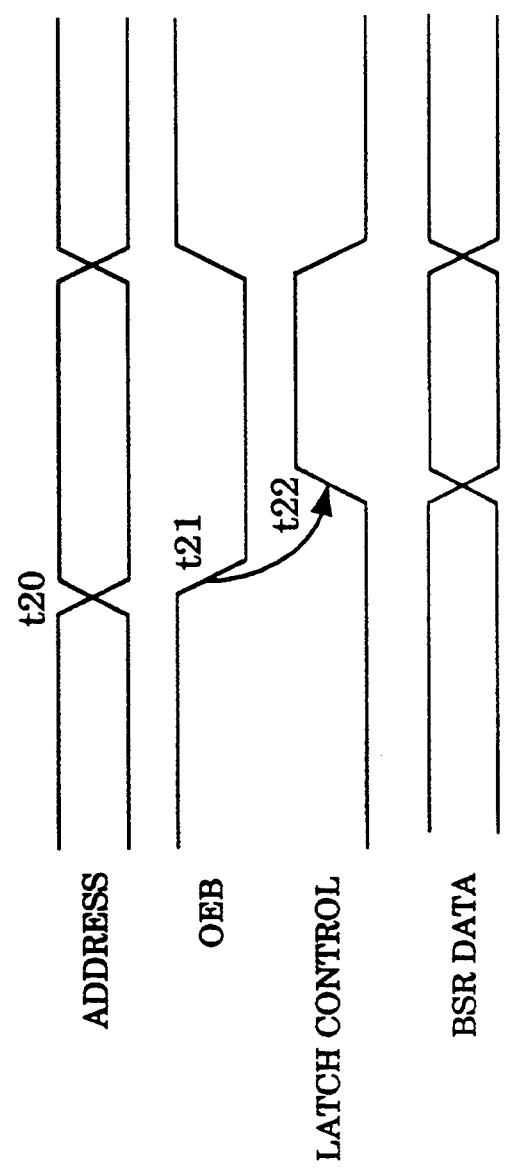
FIG. 10c is a timing diagram illustrating a user read operation of the BSR caused by a read block status register command from the CPU.

FIG. 10c is a timing diagram illustrating a read operation of the BSR 216 caused by a user read block status register command from the CPU 302. The timing diagram illustrates timing of the command bus 220 and the BSR data bus 48.

The CPU 302 reads the block status registers of the BSR 216 by transmitting a read block status register command to the command state machine 210 over the host bus 306. The read block status register command includes a 5 bit BSR address for selecting one of the block status registers in the BSR 216.

At time t20, the command state machine 210 transfers the BSR address over the interface address 223 to the interface read decoder 510. The interface read decoder 510 decodes the block status register address.

At time t21, the CPU 302 asserts an output enable (OEB) signal over the control bus 106. The OEB signal causes the command state machine 210 to issue the interface read signal 222. The interface read signal 222 causes the interface read decoder 510 to generate the appropriate interface read signal to read the selected block status register row of the BSR cells 230-257.

Between times t21 and t22, the read data from the selected block status register row of the BSR cells 230-257 is received by the interface output latch 512 over the interface read lines 406.

At time t22, a low to high transition of the latch control signal 429 causes the interface output latch 512 to latch read data on the interface read lines 406. Thereafter, The latched read data is valid on the BSR data bus 48. The command state machine 210 causes the output multiplexer 45 to transfer the read data on the BSR data bus 48 over the data bus 104.

In the foregoing specification the invention has been described with reference to specific exemplary embodiments thereof. It will, however, be evident that various modifications and changes may be made thereto without departing from the broader spirit and scope of the invention as set forth in the appended claims. The specification and drawings are accordingly to be regarded as illustrative rather than a restrictive sense.

What is claimed is:

1. A method for providing a block status of a flash array block in a flash memory device, comprising the steps of:

receiving a program or erase command from a user, such that the program erase command specifies the flash array block from among a plurality of available flash array blocks in the flash memory device;

storing the program or erase command in a command queue;

retrieving the program or erase command from the command queue and performing a program or erase operation on the flash array block;

accessing a block status register corresponding to the flash array block from among a set of available block status registers, wherein each available block status registers corresponds to one of the available flash array blocks;

setting at least one status bit in the block status register;

reading the block status register and transferring the status bit to the user.

2. The method of claim 1, wherein the status bit comprises a lock bit indicating whether the flash array block is inhibited from the program or erase operation.

3. The method of claim 1, wherein the status bit comprises an op fail bit indicating whether a previous program or erase operation to the flash array block failed.

4. The method of claim 1, wherein the status bit comprises an abort bit indicating whether the program or erase operation on the flash array block was terminated before completion.

5. The method of claim 1, wherein the status bit comprises a queue full bit indicating whether the command queue is full.

6. The method of claim 1, wherein the status bit comprises a low Vpp bit indicating whether a low Vpp condition was detected during the program or erase operation on the flash array block.

7. The method of claim 1, wherein the status bit comprises a ready/busy bit indicating whether a program or erase operation is being performed on the flash array block.

8. The method of claim 7, further comprising the step of generating an override ready/busy bit, and substituting the override ready/busy bit for the ready/busy bit if a program or erase operation is pending for the flash array block in the command queue.

9. A circuit for providing a block status of a flash array block in a flash memory device, comprising:
   circuit for receiving a program or erase command from a user, such that the program or erase command specifies the flash array block from among a plurality of available flash array blocks in the flash memory device;
   circuit for storing the program or erase command in a command queue;
   circuit for retrieving the program or erase command from the command queue and performing a program or erase operation on the flash array block;
   circuit for accessing a block status register corresponding to the flash array block from among a set of available block status registers, wherein each available block status registers corresponds to one of the available flash array blocks;
   circuit for setting at least one status bit in the block status register;
   circuit for reading the block status register and transferring the status bit to the user.

10. The circuit of claim 9, wherein the status bit comprises a lock bit indicating whether the flash array block is inhibited from the program or erase operation.

11. The circuit of claim 9, wherein the status bit comprises an op fail bit indicating whether a previous program or erase operation to the flash array block failed.

12. The circuit of claim 9, wherein the status bit comprises an abort bit indicating whether the program or erase operation on the flash array block was terminated before completion.

13. The circuit of claim 9, wherein the status bit comprises a queue full bit indicating whether the command queue is full.

14. The circuit of claim 9, wherein the status bit comprises a low Vpp bit indicating whether a low Vpp condition was detected during the program or erase operation on the flash array block.

15. The circuit of claim 9, wherein the status bit comprises a ready/busy bit indicating whether a program or erase operation is being performed on the flash array block.

16. The circuit of claim 15, further comprising circuit for generating an override ready/busy bit, and substituting the override ready/busy bit for the ready/busy bit if a program or erase operation is pending for the flash array block in the command queue.

* * * * *